United States Patent
Bosselmann et al.

(10) Patent No.: US 6,297,625 B1
(45) Date of Patent: Oct. 2, 2001

(54) METHOD AND DEVICE FOR MEASURING A MAGNETIC FIELD

(75) Inventors: Thomas Bosselmann, Erlangen; Stefan Hain, Effeltrich; Michael Willsch, Fürth, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/485,724

(22) PCT Filed: Jul. 23, 1998

(86) PCT No.: PCT/DE98/02081
§ 371 Date: Feb. 14, 2000
§ 102(e) Date: Feb. 14, 2000

(87) PCT Pub. No.: WO99/08120
PCT Pub. Date: Feb. 18, 1999

(30) Foreign Application Priority Data
Aug. 12, 1997 (DE) .................... 197 34 894

(51) Int. Cl.[7] .................................... G01R 31/00
(52) U.S. Cl. ............................. 324/96; 324/244.1
(58) Field of Search .................... 324/244.1, 96, 324/253, 117 R; 359/280–283, 244, 245, 247; 85/12

(56) References Cited

U.S. PATENT DOCUMENTS

| 4,916,387 | * | 4/1990 | Miller .................. 324/96 |
| 5,834,933 | * | 10/1998 | Meier ................. 324/117 R |
| 6,034,523 | * | 3/2000 | Bosselmann et al. ....... 324/117 R |
| 6,154,022 | * | 11/2000 | Willsch et al. .......... 324/96 |

FOREIGN PATENT DOCUMENTS

| 31 41 325 A1 | 4/1983 | (DE) . |
| 195 45 759 A1 | 6/1997 | (DE) . |
| 0 729 033 A2 | 8/1996 | (EP) . |
| WO 93/15410 | 8/1993 | (WO) . |

* cited by examiner

Primary Examiner—Ernest Karlsen
Assistant Examiner—Russell M. Kobert
(74) Attorney, Agent, or Firm—Schiff Hardin & Waite

(57) ABSTRACT

According to the present invention, in a method, two polarized light signals are sent in opposite directions through a sensor exhibiting the Faraday effect. To minimize the influence of light portions that are reflected on light paths, one light signal is transmitted on one wavelength, and the other is transmitted on another wavelength. The present invention is applicable in particularly vibration-compensated magneto-optical current converters for purposes of avoiding the influence of back-reflections on the measuring signal.

12 Claims, 2 Drawing Sheets

METHOD AND DEVICE FOR MEASURING A MAGNETIC FIELD

BACKGROUND OF THE INVENTION

The present invention relates to a method and to a device for measuring a magnetic field The invention relates to a method for measuring a magnetic field as claimed in the preamble of claim 1 and to a means for carrying out the method.

German patent application No. 19545759 proposes a method for measuring a magnetic field and a means for carrying out this method. In particular, the proposed method and the proposed means serve for the measuring of a magnetic alternating field, particularly a magnetic alternating field in the environment of an electrical conductor that is passed by an alternating current.

Since the strength of the alternating current flowing though the conductor can be deduced from the strength of the alternating field measured in the environment of the conductor, when so applied the proposed method and the proposed means can be seen as a means and method for measuring current.

The optical sensing means exhibiting the Faraday effect consists of a body which is arranged in the magnetic field and which consists of a material that is transparent to light and that exhibits the Faraday effect, through which polarized light is delivered, it being possible to deduce the strength of the magnetic field from the magnitude of a torsion of the polarization planes in the passing of the light through the body.

When applied for purposes of current measurement, the transparent body of the sensing means surrounds the electrical conductor, and the polarized light is conducted in the body, accordingly.

The light is fed to the body of the sensing means on an optical path that can comprise one or more optical fibers in addition to fiber couplers for coupling the fibers with one another or for coupling a fiber with a detection means.

Vibrations occurring in the light path, for instance in a fiber, can cause undesirable disturbances in the measuring signal.

SUMMARY OF THE INVENTION

In accordance with the present invention, in a method and a device operating according to the method, a vibration compensation is achieved by conducting light through a magneto-optical sensing device in an opposite direction, thus cutting out the influence of vibrations in the measuring signal.

In any case, there are transmitted and reflected light portions. The transmitted light portions contain the measuring signal; the reflected light portions originate from jumps in the refractive index in the optical paths and act to further interfere.

If as in the present inventive method and in the present inventive device, two light sources are used instead of one, then the optical path on which the optical signal passes through the sensing means in one direction can be separated from the optical path on which the light signal passes through the sensing means in the opposite direction. This has been achieved previously by Miller, ABB, and also Sundstrom in that two light sources in the form of LEDs which generate the two optical signals are cycled in alternation, so that the back-reflected portions are shut out of the other optical path completely.

One problem with this is the relatively high clock frequency, which must lie significantly above the bandwidth of the relevant means. Given the required modulation frequencies of some tens of KHz, the emitted optical signal no longer follows the modulated rectangular shape precisely, but rather exhibits distortions—the edge steepness drops, overshoots can occur—which compromise the accuracy of the measurement.

In an embodiment, two light sources and opposing light conduction are used, thereby having the advantage that the influence of the light portions reflected on the optical path can be minimized without a push-pull modulation.

In an embodiment, in a method for measuring a magnetic field, said method comprising the steps of: transmitting a first light signal having a first polarization and a first wavelength through an optical sensor in a first direction, said optical sensor exhibiting a Faraday effect and being arranged in a region of said magnetic field; passing said transmitted first light signal through a first analyzer set to a second polarization; sending said passed first light signal to a first optical detector for detecting said first light signal, said first optical detector responding only to said first wavelength and at least not significantly to a second wavelength; generating a first intensity signal corresponding to a light intensity of said detected first light signal; transmitting a second light signal having a third polarization and said second wavelength different from said first wavelength through said optical sensor in a second direction opposite said first direction; passing said transmitted second light signal through a second analyzer set to a fourth polarization; sending said passed second light signal to a second optical detector for detecting said second light signal, said second optical detector responding only to said second wavelength; generating a second intensity signal corresponding to a light intensity of said detected second light signal; and deriving a measuring signal containing information about said magnetic field from said first intensity signal and said second intensity signal.

This advantage is inventively achieved in that, instead of the push-pull modulation or the time division multiple access method, a frequency division multiple access method is used for the two light sources; that is, the two light sources emit on different wavelengths. If a wavelength-dependent pass filter is placed in front of each detector, the two signal paths can be separated form one another entirely.

In an embodiment, the detectors and the filter are integrated with each other. Semiconductor sources are typically used as light sources, and semiconductor detectors are typically used as detectors. Based on the band spacing, the semiconductor light sources and detectors comprise a natural filtering characteristic. If the semiconductor light sources and detectors are chosen skillfully, one semiconductor detector can detect essentially only the light of one of the two semiconductor light sources, and the other semiconductor detector can detect essentially only the light of the other semiconductor light source.

Semiconductors in the form of Si and InGaP PIN diodes are cited here as examples. If a laser diode that emits at a wavelength of 670 nm is selected for one light source, then its signal can be received only by the Si diode, while the signal of a second light source, which emits at a wavelength of 1300 nm, can be received only by the InGaP diode. In this way, a high separation of optical paths or channels can be achieved in an economical manner without disturbing back-reflection or modulation.

To make the measuring signal independent of intensity fluctuations of the light signals emitted by the two light sources, the intensity of each of these light signals must be determined by means of a respective reference photoreceiver and incorporated into the signal evaluation.

The object of the present invention is also achieved in a device for measuring a magnetic field, the device comprising: an optical sensor exhibiting the Faraday effect and being arranged in a region of a magnetic field, said optical sensor having a first gate and a second gate for coupling light into said optical sensor and for coupling out light that has been coupled into said optical sensor through an other of said first gate and second gate and that has passed through said optical sensor; a first light source for generating a first light signal at a first wavelength; a second light source for generating a second light signal at a second wavelength; a first optical path leading from said first light source to one of said first gate and second gate for transmitting said first light signal to said first gate and said second gate; a second optical path leading from said second light source to an other of said first gate and said second gate than said first optical path for transmitting said second light signal to said other of said first gate and said second gate; a first polarizer for generating a polarization of said first light signal, said first polarizer being arranged in said first optical path; a second polarizer for generating a polarization of said second light signal, said second polarizer being arranged in said second optical path; a first optical detector that responds only to said first wavelength and at least not significantly to said second wavelength, said first optical detector for generating a first intensity signal corresponding to a light intensity of said detected first light signal; a second optical detector that responds only to said second wavelength and at least not significantly to said first wavelength, said second optical detector for generating a second intensity signal corresponding to a light intensity of said detected second light signal; a third optical path connected between said second gate of said optical sensor and said first optical detector for transmitting said first light signal that is coupled out of said second gate to said first optical detector means; a fourth optical path connected between said first gate of said optical sensor and said second optical detector for transmitting said second light signal that is coupled out of said first gate to said second optical detector; a first analyzer arranged in said third optical path and being set to a third polarization that is allocated to said first light signal; a second analyzer arranged in said fourth optical path and being set to a fourth polarization that is allocated to said second light signal; and an evaluator for deriving a measuring signal containing information about said magnetic field from said first intensity signal and said second intensity signal.

The inventive method and the inventive device are advantageously suitable for realizing vibration-compensated magneto-optical current converters in which the influence of back-reflections on the measuring signal is minimized.

These and other features of the invention(s) will become clearer with reference to the following detailed description of the presently preferred embodiments and accompanied drawings.

DETAILED DESCRIPTION OF THE PRESENTLY PREFERRED EMBODIMENTS

Figure 1:
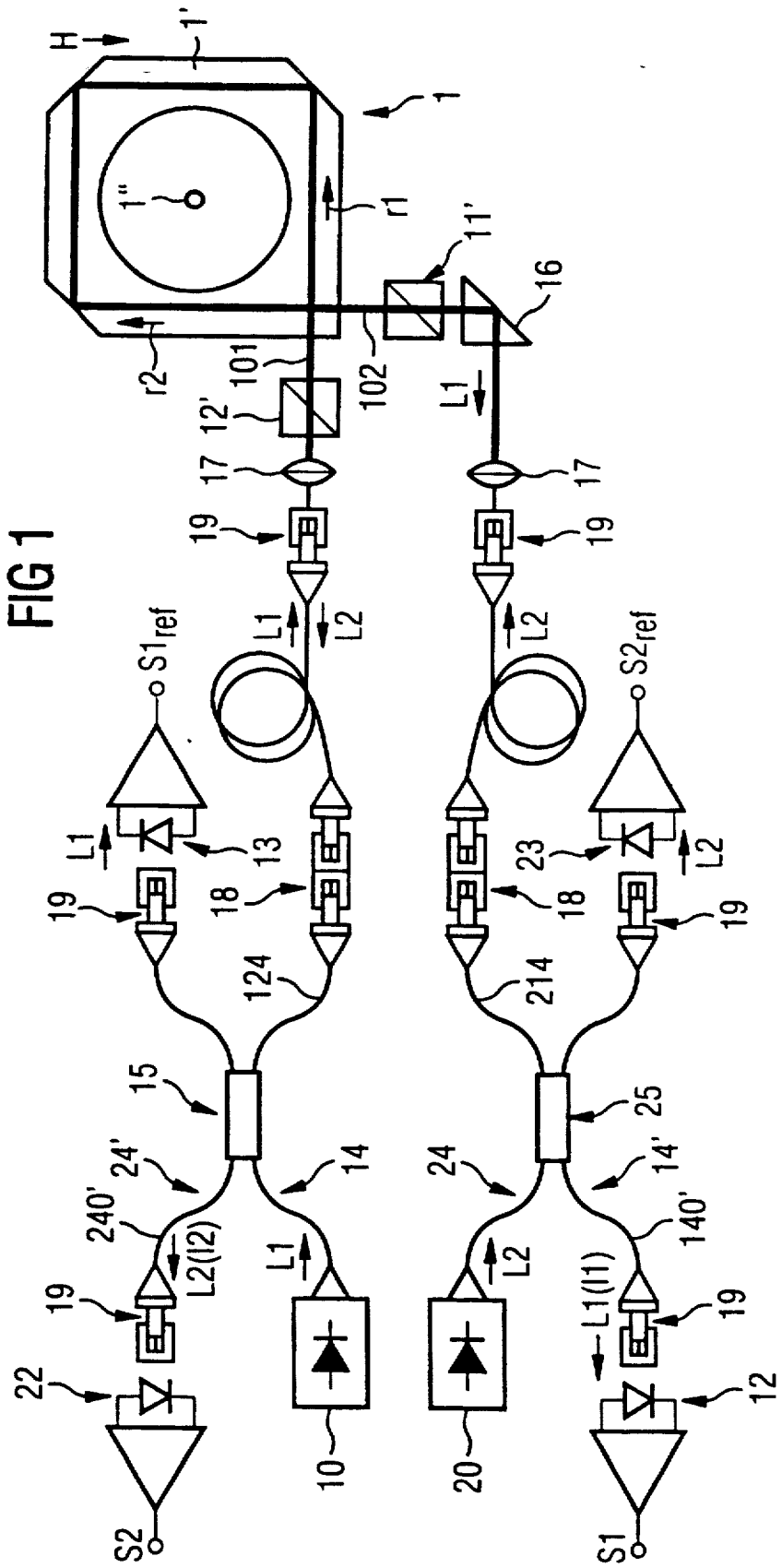
FIG. 1 is a schematic block diagram of a device constructed and operated in accordance with the present invention.

The exemplifying embodiment illustrated in FIG. 1 of an inventive device is a device for measuring the current intensity of the alternating current of the electrical conductor 1" running perpendicular to the plane of projection, for example, which current generates magnetic alternating field H in the environment of the conductor 1".

The field strength of this alternating field h is measured using the sensor 1, which comprises a body 1' made of a photo-transparent material exhibiting the Faraday effect, which surrounds the conductor 1", through which body polarized light is delivered, whereby the magnitude of a torsion of the polarization plane in the alternating field H is a measure of the field intensity and thus of the current strength.

For example, the body 1' consists of a glass ring as illustrated in FIG. 1 that surrounds the conductor 1" and is arranged in a plane standing perpendicular to the direction of the conductor 1" and thus parallel to the plane of projection; or of a fiber-optic coil that surrounds the conductor 1" multiple times for purposes of conducting the polarized light about the conductor 1". The glass ring 1' is likewise so constructed as to conduct the light on an optical path that surrounds the conductor 1" entirely.

The body 1' comprises a gate 101 for coupling the polarized light into the body 1' and a gate 102 for coupling out the light that has gone through the body 1'. The gate 102 can also be used to couple the polarized light into the body 1', and the gate 101 can be used for coupling out the light that has gone through the body 1'.

Through the gate 101 a first light signal L1 of a specific polarization $p_1$ is coupled in, which travels through the body 1' of the sensor 1 in the direction r1 and is coupled out again at the gate 102 when it has passed through the body 1'.

The light signal L1 that has been coupled out at the gate 102 is fed through a first analyzer 11', which is set to a polarization $P_{11}$ that is allocated to the first light signal, of a first optical detector 12 for detecting the first light signal L1 and generating an intensity signal S1 corresponding to the light intensity I1 of the detected first light signal L1. The polarization $p_{11}$ to which the analyzer 11' is set can be freely selected, though it is preferably selected such that the plane of the polarization $p_1$ of the light signal L1 that is fed to the gate 101 and the plane of polarization $p_{11}$ stand at a 45° angle to one another.

A second light signal L2 of a specific polarization $P_2$ is coupled in through the gate 102, travels through the body 1' of the sensor means in the direction r2 opposite the direction r1, and is coupled out at the gate 101 after passing through the body 1'.

The light signal L2 coupled out at the gate 101 is fed through a first analyzer 12', which is set to a polarization $P_{21}$ that is allocated to the second light signal L2, of a second optical detector 22 for detecting the second light signal L2 and generating a second intensity signal S2 corresponding to the intensity I2 of the detected second light signal L2. The polarization $P_{21}$ to which the analyzer 12' is set can likewise be freely selected, but here too it is preferably selected such that the plane of the polarization $p_2$ of the second light signal L2 that is fed to the gate 102 and the plane of polarization $P_{21}$ stand at a 45° angle to one another.

From the first and second intensity signal S1 and S2, a measuring signal is derived that contains an item of information about the magnetic field H.

The first light signal L1 is inventively sent through the body 1' of the sensor 1 on a first wavelength λ1, and the second light signal L2 is sent through on a second wavelength λ2 that is different from the first wavelength λ1, and a first optical detector 12 is used which responds only to the first wavelength λ1 and at least not significantly to the second wavelength λ2, and a second optical detector 22 is used which responds only to the second wavelength λ2 and at least not significantly to the first wavelength λ1.

The two light signals L1 And L2 that are transmitted on different wavelengths λ1 and λ2 can be sent through the sensor 1 at the same time, which possibility is preferably realized.

An optical detector that responds to one wavelength and at least not significantly to the other wavelength can be realized with the aid of an optical filter that lets through only the one wavelength but not the other. The filter and the detector can be advantageously integrated with one another when the detectors 12 or 22 utilized for the detection of the light signal L1 or L2 transmitted on a wavelength λ1 or λ2 has the form of a semiconductor detector that also functions as an optical filter of such a nature that the filter is transparent to this wavelength λ1 or λ2 while blocking the wavelength λ2 or λ1 on which the other light signal L2 or L1 is transmitted, which is different from this wavelength λ1 or λ2.

To cut out the influence of intensity fluctuations in the light signals on the measuring signal M, prior to passing through the body 1' of the sensor 1, a specific fixed fraction $I1_{ref}$ or $I2_{ref}$ of the intensity $I7$ and $I2$ of each of the two light signals L1 or L2 that are transmitted on the different wavelengths λ1 or λ2 is fed to a respective reference detector 13 or 23 for generating a reference intensity signal $S1_{ref}$ or $S2_{ref}$ corresponding to this fraction $I1_{ref}$ or $I2_{ref}$ of the intensity $I7$ and $I2$ of this light signal L1 or L2, which reference signal is used to extract a measuring signal M that is independent of intensity fluctuations of the two light signals L1 or L2.

The intensities I1 and I2 of the light signals L1 and L2 that are fed to the detectors 12 and 22 are as follows:

$$I1 = I01(\lambda 1) \cdot V1(t) \cdot (1 + F(I, \lambda 1)) \cdot V2(t) \cdot D1$$

$$I2 = I02(\lambda 2) \cdot K \cdot V2(t) \cdot (1 - F(I, \lambda 2)) \cdot K \cdot V1(t) \cdot D2.$$

Here, V1(t) and V2(t) are the vibration damping in the light paths for the two light signals L1 and L2, which are dependent on the time t, whereby the vibration sensitivity of the light paths for the two wavelengths λ1 and λ2 can differ by a definite factor K. $(1+F(I, \lambda_2))$ and $1-F(I, \lambda_2)$ are the modulators of the two light signals due to the Faraday effect. D1 and D2 are the total dampings by the optical components along the light path for both round-trip passes, which can be balanced either by setting the sensitivity of the detectors or by DC level correction.

The signals of the reference detectors 13 and 23 are:

$$I1_{ref} = b \cdot I01(\lambda 1)$$

$$I2_{ref} = b \cdot I02(\lambda 2),$$

whereby b is a selectable constant that is preferably selected b=½.

Forming a quantity Q according to $$Q = (I2_{ref} I1 - C \cdot I1_{ref} I2)/(I2_{ref} I1 + C \cdot I1_{ref} I2),$$

whereby C is a freely selectable constant, one obtains a signal that still depends on the Faraday terms and $K^2 \cdot C$ and that is not influenced by back-reflections.

Accordingly, to derive the measuring signal M a signal that corresponds to the quantity Q is formed. This signal is formed from the signals $S2^{ref}$, S1, $S1_{ref}$ and S2, which correspond to the intensities $I2^{ref}$, I1, $I1_{ref}$ and I2, in that order, in an evaluator illustrated in FIG. 2.

Figure 3:
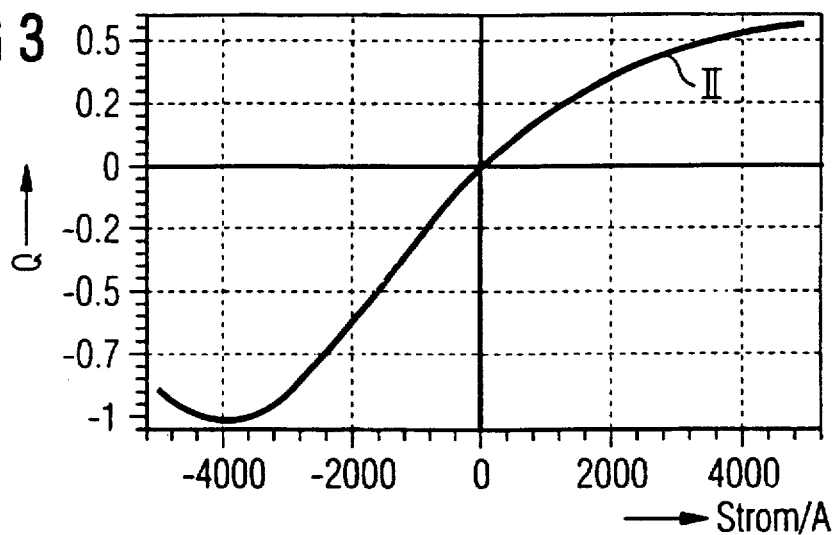
FIG. 3 shows a signal characteristic of the example illustrated in FIGS. 1 and 2.
Figure 4:
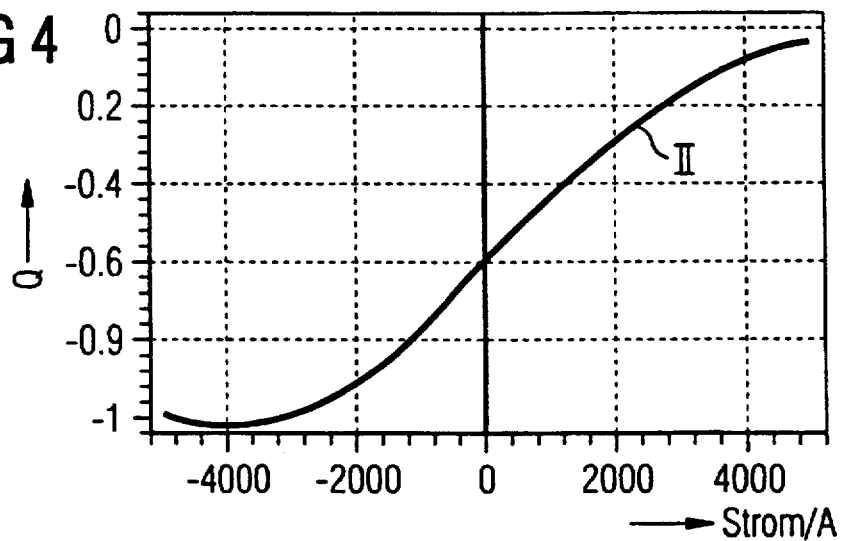
FIG. 4 shows an optimized signal characteristic of the example illustrated in FIGS. 1 and 2.

The field intensity sensitivity or current intensity sensitivity, drops with the square of the wavelength. With the aid of the constant C, the shape of the current intensity signal characteristic, which usually does not comprise a sinusoid with a zero crossing due to the different current intensity sensitivities for the two wavelengths λ1, λ2, can be optimized. For the case of maximal linearity of the characteristic, this contains a DC offset, which must be eliminated by a corresponding DC filter. FIG. 3 depicts the current intensity signal characteristic for K2·C=1; FIG. 4 shows this characteristic for optimized C. In these Figures, the current intensity is plotted on the abscissa, and the signal Q is plotted on the ordinate. The characteristics are referenced II.

Figure 2:
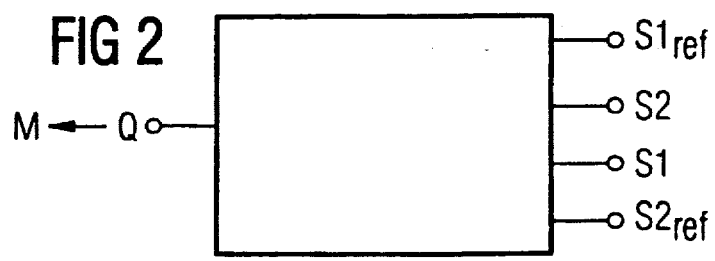
FIG. 2 is a schematic block diagram of an evaluating device of the example illustrated in FIG. 1.

In the device illustrated in the FIGS. 1 and 2 for carrying out the inventive method, the light signal L1 is generated by the light source 10 on the wavelength λ1, and the light signal L2 is generated by the light source 20 on the wavelength λ2.

From the light source 10 a light path 14 leads to the gate 101 for purposes of transmitting the light signal L1 to this gate 101, and from the light source 20 a light path 24 leads to the other gate 102 for purposes of transmitting the light signal L2 to the other gate 102.

The polarizer 12' for generating the polarization p1 of the first light signal L1 is arranged in the light path 14, the polarizer 12', and the polarizer 11' for generating the polarization p2 of the second light signal L2 is arranged in the light path 24.

A light path 14' leads from the other gate 102 of the sensor 1 to the optical detector 12 for transmitting the light signal L1 that is coupled out of this other gate 102 to this detector 12, and a light path 24' leads from a gate 101 of the sensor 1 to the optical detector 22 for transmitting the light signal L2 that is coupled out of the one gate 101 to this detector 22.

The two optical paths 14 and 24' have a common segment 124, which is located between an optical coupler 15 arranged in the optical path 14 and the gate 101 and on which are transmitted both the signal L1 from the light source 10 that is to be fed to the gate 101 and the light signal L2 that is to be fed from the gate 101 to the detector 22.

The two optical paths 24 and 14' likewise comprise a common segment 214, which is located between an optical coupler 25 arranged in the optical path 24 and the gate 102 and on which are transmitted both the light signal L2 from the light source 20 that is to be fed to the gate 102 and the light source L1 that is to be fed from the gate 102 to the detector 12.

The coupler 15 is transparent to the light signal L1 from the light source 10 that is to be fed to the gate 101, and it acts like a filter to the light signal L2 from the gate 101 that is to be fed to the detector 22, bringing this signal L2 onto a segment 240' of the optical path 24' leading to the detector 22 that leads from the coupler 15 to the detector 22, which segment is separate from the optical path 14 leading from light source 10 to the gate 101.

The coupler 25 is likewise transparent to the light signal L2 from the light source 20 that is to be fed to the gate 102, and it acts as a filter to the light signal L1 from the gate 102 that is to be fed to the detector 12, bringing this signal L1 onto a segment 140' of the optical path 14' leading to the detector 12 that leads from the coupler 15 to the detector 12, which is separate from the optical path 24 leading from the light source 10 to the gate 101.

The polarizer 12' for generating the polarization p1 of the light signal L1 that is to be fed to the gate 101 is arranged in the common segment 124 and simultaneously forms the analyzer 12', which is set to the polarization p21 allocated to the light signal L2 from this gate 101.

The polarizer 11' for generating the polarization p2 of the light signal L2 that is to be fed to the gate 102 is arranged in the common segment 214 and simultaneously forms the analyzer 11', which is set to the polarization p11 that is allocated to the light signal L1 from this gate 102.

The coupler 15 further couples the specific definite fraction $I1_{ref}$ of the intensity I1 of the light signal L1 generated by this light source 10 out of the optical path 14 and feeds this fraction $I1_{ref}$ to a reference detector 13 for generating a reference intensity signal $S1_{ref}$ corresponding to the this fraction $I_{ref}$ of the intensity I1 of this light signal L1.

The coupler 25 couples the definite fraction $I2_{ref}$ of the intensity I2 of the light signal L2 generated by this light source 20 out of the optical path 24 and feeds this fraction $I2^{ref}$ to a reference detector 23 for generating a reference intensity signal S21 ref that corresponds to this fraction $I2_{ref}$ of the intensity I2 of this light signal L2.

To this end, each coupler 15 and 25 comprises a four-gate wavelength-selective optical directional coupler in which the intensity of the light signal L1 or L2 on the wavelength $\lambda 1$ or, $\lambda 2$ is split, whereas the intensity of the light signal L2 or L1 on the other wavelength $\lambda 2$ or $\lambda 1$ is transmitted from one gate of the directional coupler to another essentially complete.

The optical paths 14, 24, 14', and 24' are preferably realized using optical fibers. The reference characters 18 and 19 in FIG. 1 designate fiber couplers for connecting fibers to detectors or other optical means and for coupling fibers to each other. 17 references collimators, and 16 references a deflecting mirror.

Although modifications and changes may be suggested by those of ordinary skill in the art, it is the intention of the inventors to embody within the patent warranted hereon all changes and modifications as reasonably and properly come within the scope of their contribution to the art.

We claim as our invention:

1. A method for measuring a magnetic field, said method comprising the steps of:
   transmitting a first light signal having a first polarization and a first wavelength through an optical sensor in a first direction, said optical sensor exhibiting a Faraday effect and being arranged in a region of said magnetic field;
   passing said transmitted first light signal through a first analyzer set to a second polarization;
   sending said passed first light signal to a first optical detector for detecting said first light signal, said first optical detector responding only to said first wavelength and at least not significantly to a second wavelength;
   generating a first intensity signal corresponding to a light intensity of said detected first light signal;
   transmitting a second light signal having a third polarization and said second wavelength different from said first wavelength through said optical sensor in a second direction opposite said first direction;
   passing said transmitted second light signal through a second analyzer set to a fourth polarization;
   sending said passed second light signal to a second optical detector for detecting said second light signal, said second optical detector responding only to said second wavelength and at least not significantly to said first wavelength;
   generating a second intensity signal corresponding to a light intensity of said detected second light signal; and
   deriving a measuring signal containing information about said magnetic field from said first intensity signal and said second intensity signal.

2. The method as claimed in claim 1, wherein said first light signal transmitted at said first wavelength and said second light signal transmitted at said second wavelength are transmitted through said optical sensor simultaneously.

3. The method as claimed in claim 1,
   wherein said first optical detector is a semiconductor detector that simultaneously acts as an optical filter being transparent to said first wavelength but blocking said second wavelength; and
   wherein said second optical detector is a semiconductor detector that simultaneously acts as an optical filter being transparent to said second wavelength but blocking said first wavelength.

4. The method as claimed in claim 1, further comprising the steps of:
   prior to passing through said optical sensor, feeding a specific first fixed fraction of said intensity of said first light signal to a first reference detector;
   generating a first reference intensity signal corresponding to said first fixed fraction of said intensity of said first light signal;
   prior to passing through said optical sensor, feeding a specific second fixed fraction of said intensity of said second light signal to a second reference detector;
   generating a second reference intensity signal corresponding to said second fixed fraction of said intensity of said second light signal; and
   deriving a measuring signal using said first and second reference intensity signals, said measuring signal being independent of intensity fluctuations of said first light signal and said second light signal.

5. The method as claimed in claim 4, wherein said measuring signal is derived by forming quantity corresponding to a quotient $$Q=(I2_{ref} \cdot I1 - C \cdot I1_{ref} \cdot I2)/(I2_{ref} \cdot I1 + C \cdot I1_{ref} \cdot I2).$$

wherein
   $I2_{ref}$ is a defined fraction of said intensity of said second light signal, which second light signal is transmitted to said optical sensor at said second wavelength,
   I1 is said intensity of said first light signal, which first light signal is sent to said first detector at said first wavelength,
   C is a freely selectable constant,
   $I1_{ref}$ is said first fixed fraction of said intensity of said first light signal, which first light signal is transmitted to said optical sensor at said first wavelength, and
   I2 is said intensity of said second light signal, which second light signal is sent to said second detector on said second wavelength.

6. The method according to claim 1, wherein said method is applied for realizing magneto-optical current converters in which an influence of back-reflections on said measuring signal is minimized.

7. A device for measuring a magnetic field, said device comprising:

an optical sensor exhibiting the Faraday effect and being arranged in a region of a magnetic field, said optical sensor having a first gate and a second gate for coupling light into said optical sensor and for coupling out light that has been coupled into said optical sensor through an other of said first gate and second gate and that has passed through said optical sensor;

a first light source for generating a first light signal at a first wavelength;

a second light source for generating a second light signal at a second wavelength;

a first optical path leading from said first light source to one of said first gate and second gate for transmitting said first light signal to said first gate and said second gate;

a second optical path leading from said second light source to an other of said first gate and said second gate than said first optical path for transmitting said second light signal to said other of said first gate and said second gate;

a first polarizer for generating a polarization of said first light signal, said first polarizer being arranged in said first optical path;

a second polarizer for generating a polarization of said second light signal, said second polarizer being arranged in said second optical path;

a first optical detector that responds only to said first wavelength and at least not significantly to said second wavelength, said first optical detector for generating a first intensity signal corresponding to a light intensity of said detected first light signal;

a second optical detector that responds only to said second wavelength and at least not significantly to said first wavelength, said second optical detector for generating a second intensity signal corresponding to a light intensity of said detected second light signal;

a third optical path connected between said second gate of said optical sensor and said first optical detector for transmitting said first light signal that is coupled out of said second gate to said first optical detector means;

a fourth optical path connected between said first gate of said optical sensor and said second optical detector for transmitting said second light signal that is coupled out of said first gate to said second optical detector;

a first analyzer arranged in said third optical path and being set to a third polarization that is allocated to said first light signal;

a second analyzer arranged in said fourth optical path and being set to a fourth polarization that is allocated to said second light signal; and an evaluator for deriving a measuring signal containing information about said magnetic field from said first intensity signal and said second intensity signal.

8. A device as claimed in claim 7, wherein said first optical path and said third optical path comprise a first common segment for passing both said first light signal from said first light source to said first gate and said second light signal from said first gate to said second optical detector; and wherein said second optical path and said fourth optical path comprise a second common segment for passing both said second light signal from said second light source to said second gate and said first light signal from said second gate to said first optical detector; and said device further comprising:

a first optical coupler located at an end of said first common segment opposite said first gate, said first optical coupler for being transparent to said first light signal from said first light source, for being a filter to said second light signal from said first gate, and for bringing said second light signal onto a third segment of said second optical path to said second optical detector that leads from said first optical coupler to said second optical detector, said third segment being separate from said second optical path leading from said light source to said first gate;

a second optical coupler located at an end of said second common segment opposite said second gate, said second optical coupler for being transparent to said second light signal from said second light source, for being a filter to said first light signal from said second gate, and for bringing said first light signal onto a fourth segment of said first optical path to said first optical detector that leads from said second optical coupler to said first optical detector, said fourth segment being separate from said first optical path leading from said second light source to said second gate;

a first polarizer for generating a polarization of said first light signal to be transmitted to said first gate, said first polarizer being arranged in said first common segment and simultaneously forming said first analyzer, which is set to a third polarization being allocated to said first light signal from said first gate; and a second polarizer for generating a polarization of said second light signal to be transmitted to said second gate, said second polarizer being arranged in said second common segment and simultaneously forming said second analyzer, which is set to a fourth polarization being allocated to said second light signal from said second gate.

9. A device as claimed in claim 7, further comprising:

a first detector for detecting said first light signal of said first wavelength, said first detector being a semiconductor detector that simultaneously acts as an optical filter being transparent to said first wavelength but blocking said second wavelength; and a second detector for detecting said second light signal of said second wavelength, said second detector being a semiconductor detector that simultaneously acts as an optical filter being transparent to said second wavelength but blocking said first wavelength.

10. A device as claimed in claim 7, further comprising:

a first coupler arranged in said first optical path for coupling a first fixed fraction of said intensity of said first light signal generated by said first light source out of said first optical path and for feeding said first fixed fraction to a first reference detector for generating a first reference intensity signal corresponding to said first fixed fraction of said intensity of said first light signal; and a second coupler arranged in said second optical path for coupling a second fixed fraction of said intensity of said second light signal generated by said second light source out of said second optical path and for feeding said second fixed fraction to a second reference detector for generating a second reference intensity signal corresponding to said second fixed fraction of said intensity of said second light signal.

11. A device as claimed in claim 10, wherein said evaluator is for forming a quantity that corresponds to a quotient $$Q=(I2_{ref}\cdot I1-C\cdot I1_{ref}\cdot I2)/(I2_{ref}\cdot I1+C\cdot I1_{ref}\cdot I2),$$

wherein $I2_{ref}$ is a defined fraction of said intensity of said second light signal, which second light signal is transmitted to said optical sensor at said second wavelength, $I1$ is said intensity of said first light signal, which first light signal is sent to said first detector at said first wavelength, C is a freely selectable constant, $I1_{ref}$ is said first fixed fraction of said intensity of said first light signal, which first light signal is transmitted to said optical sensor at said first wavelength, and $I2$ is said intensity of said second light signal, which second light signal is sent to said second detector on said second wavelength.

12. The device according to claim 7, wherein said device is for realizing magneto-optical current converters in which an influence of back-reflections on said measuring signal is minimized.

* * * * *